(12) United States Patent
Schwarzbauer et al.

(10) Patent No.: US 7,057,275 B2
(45) Date of Patent: Jun. 6, 2006

(54) DEVICE WITH POWER SEMICONDUCTOR COMPONENTS FOR CONTROLLING THE POWER OF HIGH CURRENTS AND USE OF SAID DEVICE

(75) Inventors: Herbert Schwarzbauer, Munich (DE); Norbert Seliger, Munich (DE)

(73) Assignee: SIEMENS Aktiengesellschaft, Munich (DE)

( * ) Notice: Subject to any disclaimer, the term of this patent is extended or adjusted under 35 U.S.C. 154(b) by 101 days.

(21) Appl. No.: 10/491,129

(22) PCT Filed: Sep. 10, 2002

(86) PCT No.: PCT/DE02/03354

§ 371 (c)(1),
(2), (4) Date: Mar. 29, 2004

(87) PCT Pub. No.: WO03/032390

PCT Pub. Date: Apr. 17, 2003

(65) Prior Publication Data

US 2004/0256710 A1   Dec. 23, 2004

(30) Foreign Application Priority Data

Sep. 28, 2001 (DE) ................................ 101 47 917
Mar. 13, 2002 (DE) ................................ 102 11 058

(51) Int. Cl.
*H01L 23/10* (2006.01)
*H01L 23/34* (2006.01)
*H01L 23/52* (2006.01)
*H01L 23/04* (2006.01)

(52) U.S. Cl. ............... 257/706; 257/691; 257/698; 257/700; 257/707; 257/727

(58) Field of Classification Search ............... 257/691, 257/698, 700, 706, 707, 727
See application file for complete search history.

(56) References Cited

U.S. PATENT DOCUMENTS

| 5,473,190 | A  | * | 12/1995 | Inoue et al. ................. 257/671 |
| 5,559,363 | A  | * | 9/1996  | Immorlica, Jr. ............. 257/664 |
| 5,574,312 | A  |   | 11/1996 | Bayerer et al. |
| 6,545,353 | B1 | * | 4/2003  | Mashino ..................... 257/724 |
| 6,586,833 | B1 | * | 7/2003  | Baliga ........................ 257/712 |
| 6,707,138 | B1 | * | 3/2004  | Crowley et al. ............ 257/676 |
| 6,762,937 | B1 | * | 7/2004  | Kimoto et al. .............. 361/699 |
| 6,914,321 | B1 | * | 7/2005  | Shinohara ................... 257/678 |

FOREIGN PATENT DOCUMENTS

| DE | 43 27 895   | 2/1995 |
| EP | 0 427 143   | 5/1991 |
| EP | 0 443 378   | 8/1991 |
| EP | 0 585 578   | 3/1994 |
| EP | 1 115 274   | 7/2001 |
| WO | WO 95/04448 | 2/1995 |

* cited by examiner

*Primary Examiner*—Ngân V. Ngô
(74) *Attorney, Agent, or Firm*—Young & Thompson

(57) ABSTRACT

A device with power semiconductor components controlling the power of high currents has each power semiconductor component insulated and fixed to a common cooled carrier body. Conductor bars, in addition to the power semiconductor components, are fixed to the carrier body, the conductor bars being electrically insulated and placed on top of each other, whereby each semiconductor bar has a free contact surface, and one electrical contact surface of each semiconductor component is electrically connected to a conductor bar by one or several electric conductor bridges and another electrical contact surface of the power semiconductor component is electrically connected to another bar conductor by one or several conductor bridges.

27 Claims, 3 Drawing Sheets

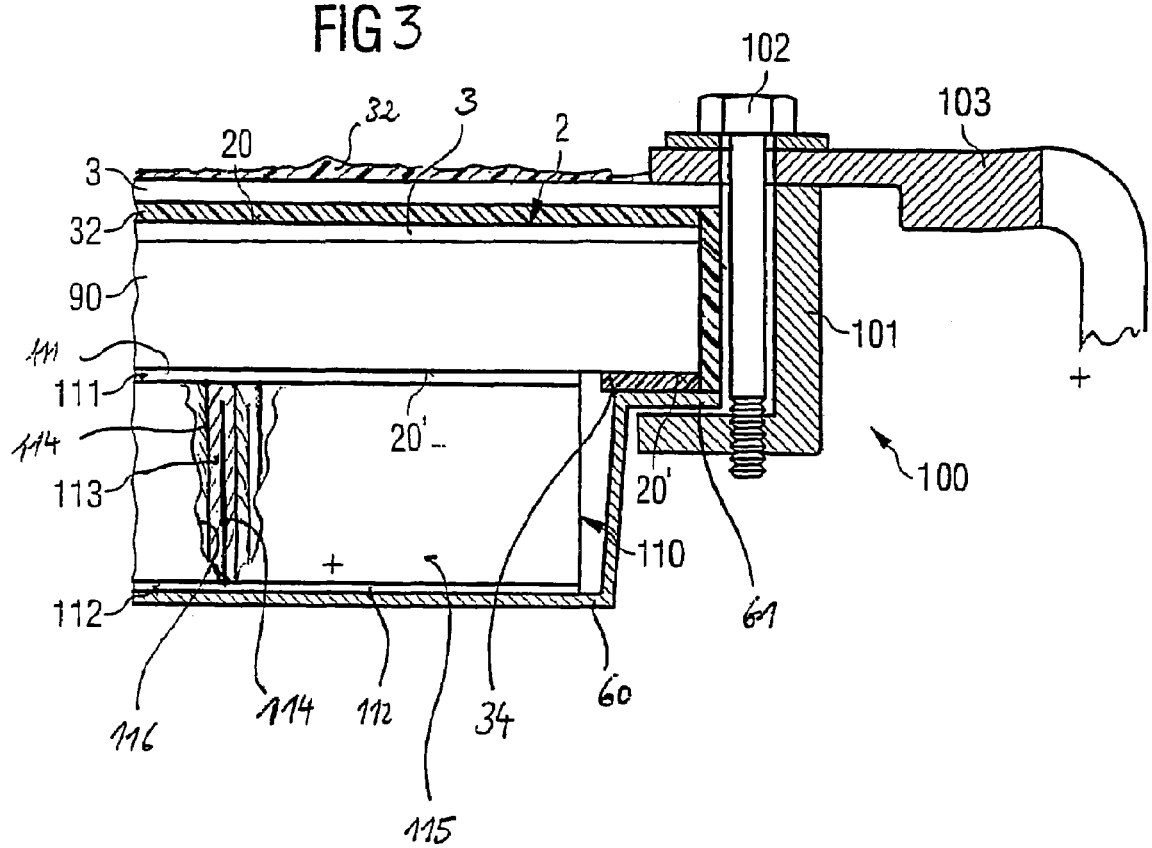

DEVICE WITH POWER SEMICONDUCTOR COMPONENTS FOR CONTROLLING THE POWER OF HIGH CURRENTS AND USE OF SAID DEVICE

BACKGROUND OF THE INVENTION

The invention relates to an arrangement with one or more power semiconductor components for high current power control.

DESCRIPTION OF THE RELATED ART

In automobile engineering, an increasing number of functions are controlled by electrical means. For example, the starter and generator may be combined into a single unit. The power supply of such systems requires more powerful supply units which, because of their large thermal dissipations, require active cooling which is provided e.g. by the circulation of cooling water.

In extreme cases the cooling water temperature can reach 125° C., which means that only a very small temperature variation is possible for all the electrical components. Because of the low vehicle electrical system voltage of only 14–42 V, very large currents and therefore short paths to the load are necessary. Consequently the control units must be installed close to the engine which constitutes a hot, high vibration environment.

Arrangements incorporating one or more power semiconductor components for high current power control are generally of modular design. The power semiconductor components or semiconductor switches are mounted on substrates, mainly metallized ceramic plates, in an electrically isolating manner. These sub-units are fixed to a supporting structure in the form of a coolable base plate. The supply leads are routed from the substrates to pins in a package frame and ultimately to the top of the package by means of soldered-on metal links, spring contacts or bonds. Power is then supplied above the package by means of a busbar or a circuit board. This means that no space is needed on the base plate for a busbar and the size can be kept small.

As some of the electrical connection parts are now far above the base plate, they may oscillate severely in the event of vibrations and quickly fatigue the connection to the substrate.

Designs are also known whereby the supply leads for the positive electrical pole "+" and the negative electrical pole "−" are routed in antiparallel one above the other in an electrically isolated manner (see e.g. EP 585578 A1 or Mitsubishi) or additionally routed directly via substrates (see e.g. U.S. Pat. No. 5,574,312 of ABB Management AG) in order to minimize the inductance of the arrangement. Reservoir capacitors are also disposed in a low inductance manner on the free side of the busbar (see e.g. WO 9 5504 448 of KAMAN ELECTROMAGNETICS CORP.) or a heat sink is itself used as a current-carrying part (see e.g. EP 443378 A of REHM SCHWEISSTECHNIK GmbH & Co.).

SUMMARY OF THE INVENTION

The object of the invention is generally to provide an arrangement with one or more power semiconductor components for high current power control and having a long service life in a high vibration environment.

This object is achieved by an arrangement with one or more power semiconductor components for high current power control, having the features set forth below.

According to this solution, in the arrangement according to the invention incorporating one or more power semiconductor components for high current power control, each power semiconductor component is mounted in an electrically isolating manner on a surface of a common supporting structure and has at least two electrical terminal lands disposed separately from one another, two or more conductor bars disposed separately from one another being fixed to the surface of the supporting structure adjacently to the power semiconductor component(s) and electrically isolated from each power semiconductor component, and an electrical terminal land of each power semiconductor component being electrically connected to one of the conductor bars by one or more electrical bridging links and another electrical terminal land of each power semiconductor component being electrically connected to the other of the conductor bars by one or more electrical bridging links.

In the arrangement according to the invention, the conductor bars and likewise the power semiconductor components can advantageously be disposed in close proximity to one another directly on the surface of the supporting structure. This means that the oscillations of the conductor bars and power semiconductor components against one another advantageously remain negligibly small. Moreover, because of the conductor bars and power semiconductor components being disposed in close proximity to one another, advantageously short electrical bridging links are used, having natural frequencies such that they are unlikely to be excited to resonance during normal operation of the arrangement according to the invention in a high vibration environment. For these reasons the arrangement according to the invention is excellently suited for long-term use in a high vibration environment, particularly in the vicinity of a prime mover, e.g. an internal combustion engine of a motor vehicle, which moreover constitutes a hot environment.

With the arrangement according to the invention, the power semiconductors advantageously do not need to be encapsulated, but are preferably mounted bare on the supporting structure. Only the arrangement as a whole must be hermetically sealed in a package.

Preferred and advantageous embodiments of the arrangement according to the invention are detailed below.

Some embodiments include the conductor bars disposed one above the other are advantageous for a particularly compact design of the arrangement according to the invention.

As already mentioned, a preferred and advantageous application of the arrangement according to the invention is its use in a motor vehicle engine compartment and in particular, but not exclusively there, for supplying an electrical load of a motor vehicle.

An electrical load of a motor vehicle is taken to mean, for example and among other things : a starter/generator, particularly comprising a starter motor and a generator, an electric active suspension system, an electric power-assisted steering system, an electric water pump, an electric oil pump, an air conditioning system of a motor vehicle, etc.

BRIEF DESCRIPTION OF THE DRAWINGS

In the following description the invention will be explained in greater detail with reference to the drawings in which:

FIG. 3 shows a vertical section through part of the embodiment according to FIG. 2 along the line III—III in FIG. 2.

DESCRIPTION OF THE PREFERRED EMBODIMENTS

Figure 2:
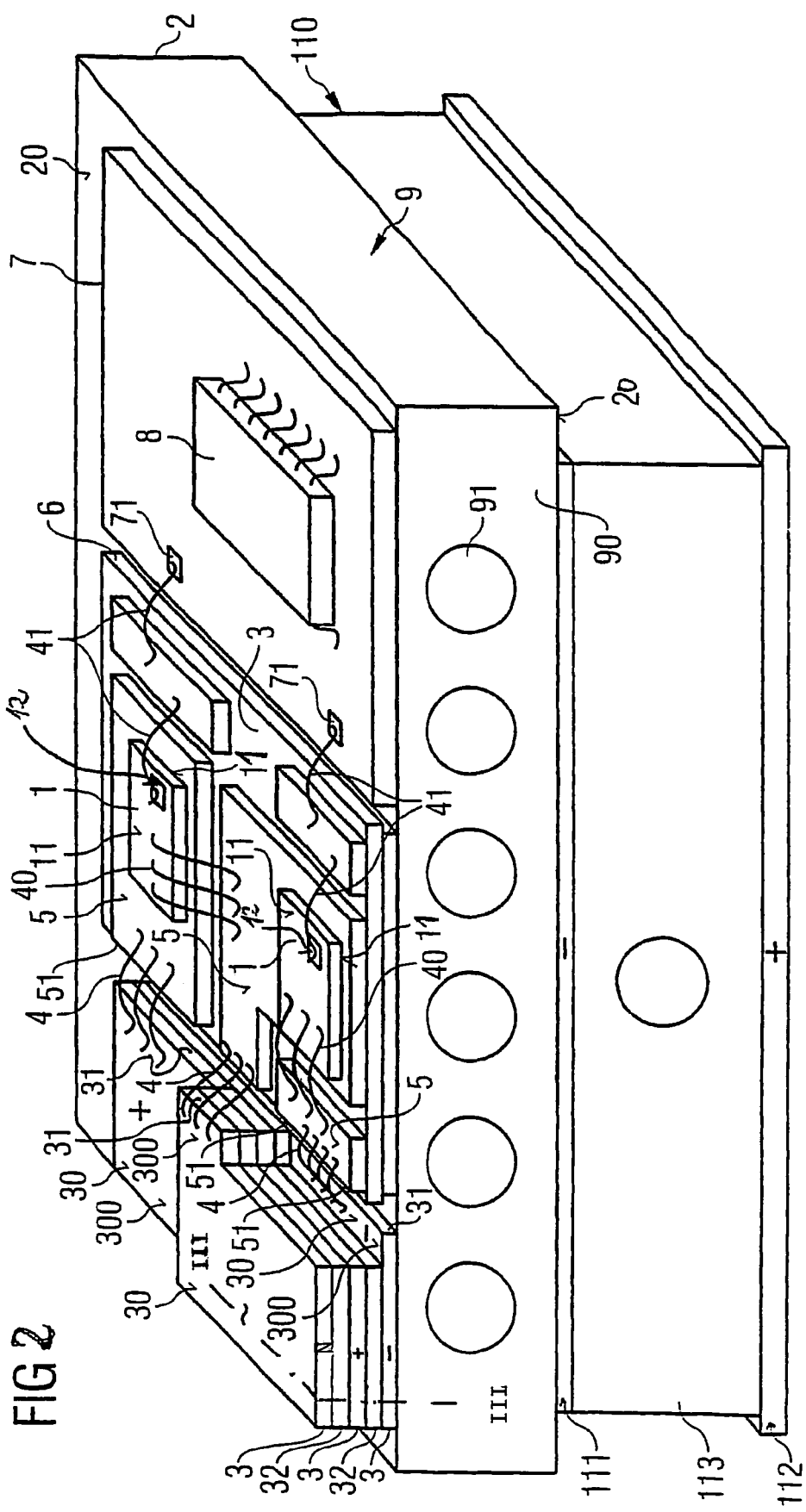
FIG. 2 shows a perspective view of another exemplary embodiment of the arrangement according to the invention with conductor bars disposed one above the other.

In the exemplary embodiments of the arrangement according to the invention as shown in FIG. 2, each power semiconductor component 1 is mounted in an electrically isolated manner on a surface 20 of a common supporting structure 2 forming e.g. a base plate.

Figure 1:
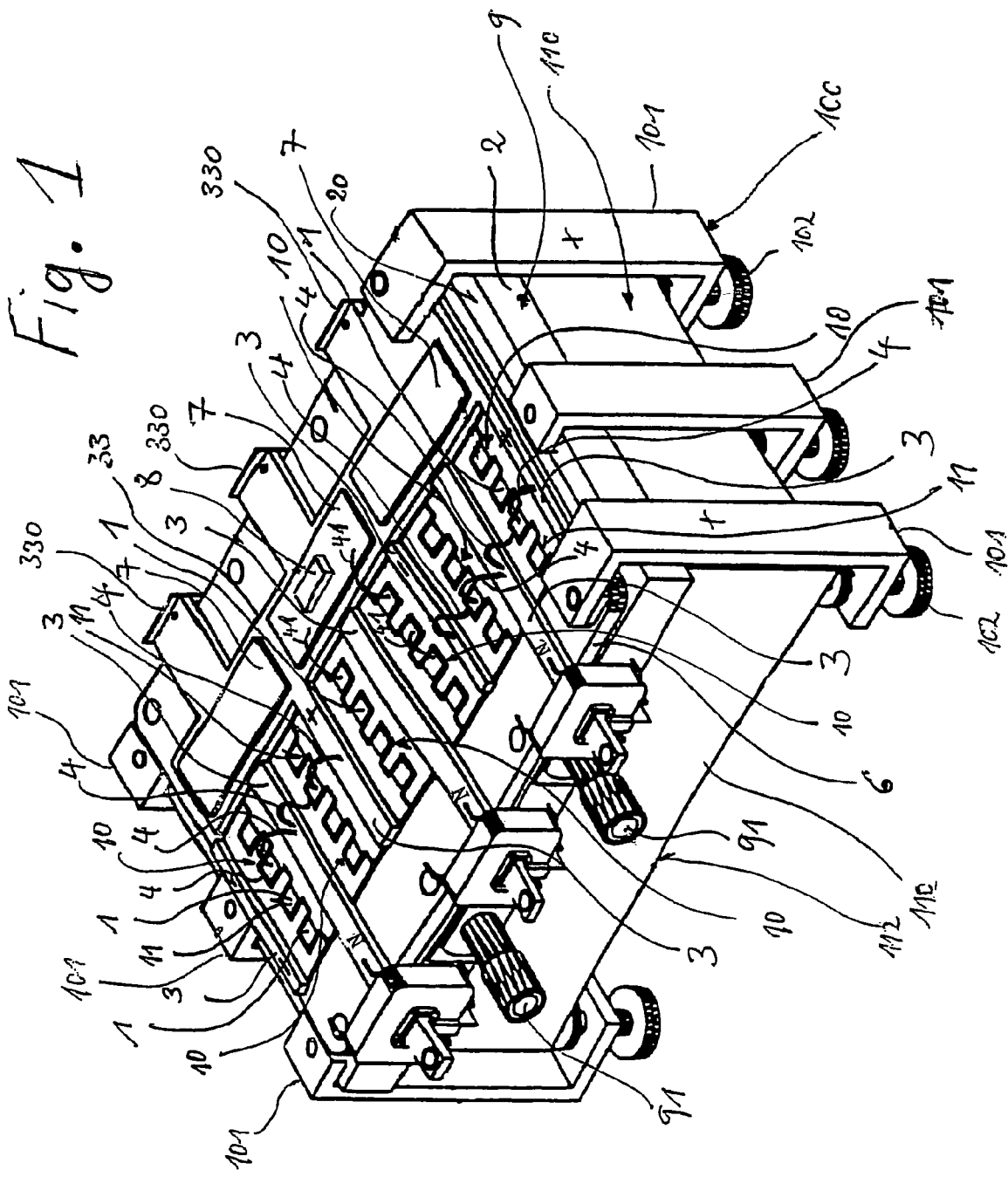
FIG. 1 shows a perspective view of an exemplary embodiment of the arrangement according to the invention with conductor bars disposed adjacently to one another.

In the embodiment according to FIG. 1, by way of example six rows 10 of four power semiconductor components 1 are disposed on the surface 20.

In the other embodiment according to FIG. 2, by way of example only two power semiconductor components 1 are shown for the sake of clarity. In this other embodiment the number of power semiconductor components 1 could also be greater than two, e.g. as many as in the embodiment according to FIG. 1 and e.g. have the same arrangement as there.

In general the number of power semiconductor components 1 can be any natural number, i.e. also one, and the figure likewise has an upper limit for technical reasons.

Each power semiconductor component 1 has at least two electrical terminal lands 11, 11 disposed separately from one another, at least one of which is disposed, for example, on a side of the power semiconductor component 1 facing away from the relevant surface 20 of the supporting structure 2 and the other on a side of said power semiconductor component 1 facing towards the surface 20 and not directly visible in FIGS. 1 and 2.

On the surface 20 of the supporting structure 2 in each of the two embodiments shown, a plurality of conductor bars 3 disposed separately from one another are mounted adjacently to the power semiconductor components 1 and electrically isolated from each power semiconductor component 1.

Likewise in each of the embodiments shown, one electrical terminal land 11 of each power semiconductor component 1 is electrically connected by one or more electrical bridging links 4 to one of the conductor bars 3, and the other electrical terminal land 11 of said power semiconductor component 1 is electrically connected by one or more electrical bridging links 4 to another of the conductor bars 3.

In particular, in each of the embodiments shown, an electrical terminal land 11 of one power semiconductor component 1 is electrically connected by one or more bridging links 4 to a conductor bar 3 assigned to one "−" electrical pole, an electrical terminal land 11 of another power semiconductor component 1 is electrically connected by one or more bridging links 4 to another conductor bar 3 assigned to the other "+" electrical pole opposite to the "−" electrical pole, and the other electrical terminal land 11 of one power semiconductor component 1 and the other terminal land 11 of the other power semiconductor component 1 are electrically connected by one or more bridging links 4 to another conductor bar 3.

For example, in the embodiments according to FIGS. 1 and 2 the configuration is preferably such that each power semiconductor component 1 is implemented as a switching or control element wherein a current dependent on the switching or control state of the component 1 flows or does not flow between its one terminal land 11 and its other terminal land 11, and that the power semiconductor component 1 connected with one terminal land 11 to the conductor bar 3 assigned to one "−" pole and the power semiconductor component 1 connected with one terminal land 11 to the other conductor bar 3 assigned to the other "+" pole are switched or controlled in a push-pull manner, i.e. a component 1 is switched off or on while the other is switched on or off and vice versa. The other conductor bar 3 connected to the other terminal land 11 of each of these two power semiconductor components 1 forms in this case specifically a phase conductor bar which is additionally identified as "N" in FIGS. 1 and 2.

The embodiment according to FIG. 1 is implemented for example in such a way that all the conductor bars 3 are disposed adjacently and parallel to one another on the surface 20 of the supporting structure 2.

Specifically the configuration for this embodiment is such that between a first conductor bar 3 located farthest right in FIG. 1 and assigned to the "+" pole and a first phase conductor bar 3 on the left adjacent thereto and designated "N" there is disposed a first row 10 of four power semiconductor components 1, between the first phase conductor bar 3 and a first conductor bar 3 on the left adjacent thereto and assigned to the "−" pole there is disposed a second row 10 of four power semiconductor components 1, between the first conductor bar 3 assigned to the "−" pole and a second phase conductor bar 3 on the left adjacent thereto and designated "N" there is disposed a third row 10 of four power semiconductor components 1, between the second phase conductor bar 3 and a second conductor bar 3 on the left adjacent thereto and again assigned to the "+" pole there is disposed a fourth row 10 of four power semiconductor components 1, between the second conductor bar 3 assigned to the "+" pole and a third phase conductor bar 3 on the left adjacent thereto and designated "N" there is disposed a fifth row 10 of four power semiconductor components 1, and between the third phase conductor bar 3 and a second conductor bar 3 on the left adjacent thereto and again assigned the "−" pole there is disposed a sixth row 10 of four power semiconductor components 1.

Two oppositely disposed power semiconductor components 1 of two adjacent rows 10 between which there is disposed a phase conductor bar 3 designated "N" are mutually assigned and form a pair of power semiconductor components 1 connected in a push-pull configuration.

FIG. 1 highlights two such pairs of mutually assigned power semiconductor components 1 by showing their power semiconductor components 1 as being connected to the relevant conductor bars 3 by individual electrical bridging links 4. For example, a bridging link 4 connects each paired component's electrical terminal land 11 facing the surface 20 of the supporting structure 2 to one conductor bar 3, and another bridging link 4 connects the electrical terminal land 11 facing away from the surface 20 to the other conductor bar 3. In a practical embodiment, each individual bridging link 4 is preferably implemented by a plurality of such links 4, e.g. as indicated in FIG. 2.

Each conductor bar 3 is preferably implemented from a material of good electrical conductivity, e.g. copper, and having a cross section large enough to handle the specified high current density.

Whereas the phase conductor bars 3 designated "N" are formed by individual bars, it is advisable to interconnect the conductor bars 3 assigned to the "+" pole by means of a common conductor bar 33. The common conductor bar 33 is preferably a plate made of a material of good electrical conductivity disposed on the surface 20 of the supporting structure 2 and from which the conductor bars 3 assigned to the "+" pole project as comb-tooth-like bars, the plate and the bars preferably forming a single piece.

The conductor bars 3 assigned to the "−" pole are also preferably interconnected by a common conductor bar which, like the conductor bars 3 assigned to the "−" pole must be electrically isolated from the conductor bars assigned to the "+" pole and from the common conductor bar 33.

In contrast to the embodiment according to FIG. 1, in the embodiment according to FIG. 2 the conductor bars 3 are disposed one above the other and electrically isolated from one another on the surface 20 of the supporting structure 2, and each of these conductor bars 3 has a free terminal land 30 which is connected by in particular a plurality of electrical bridging links 4 to an electrical terminal land 11 of at least one power semiconductor component 1. This allows in particular a more compact constructional design of the arrangement according to the invention.

In this embodiment it is possible in particular to dispose each pair of mutually assigned power semiconductor components 1, which are switched or controlled in a push-pull relationship to one another as defined above, on one and the same side of all the conductor bars 3, in contrast to the embodiment according to FIG. 1 in which the power semiconductor components 1 of any such pair are disposed on both sides of a phase conductor bar 3 and also flanked by conductor bars 3 assigned to poles different from one another.

In the embodiment according to FIGS. 2 and 3, a single pair of such power semiconductor components 1 is disposed, for example, on the right-hand side of the stacked conductor bars 3. However, there are preferably disposed on this right-hand side, although not shown, two or more pairs of mutually assigned power semiconductor components 1 in series along the stacked conductor bars 3 and connected to said conductor bars 3 in the same way as the pair of power semiconductor components 1 shown in FIG. 2.

Moreover, such pairs of mutually assigned power semiconductor components 1 can also be disposed in series on the left-hand side of the stacked conductor bars 3 facing away from the right-hand side and connected to the stacked conductor bars 3 in a similar manner to the pair of power semiconductor components 1 shown in FIG. 2.

For example, the power semiconductor devices 1 of the pair shown in FIG. 2 are connected to the stacked conductor bars 3 in such a way that an electrical terminal land 11 of one power semiconductor device 1 of the pair, said terminal land facing away from the surface 20 of the supporting structure 2, is electrically connected by a plurality of bridging links 4 to the conductor bar 3 disposed, for example, directly on the surface 20 of the supporting structure 2 and assigned to the "−" pole, an electrical terminal land 11 of the other power semiconductor device 1 of the pair, said terminal land facing the surface 20 of the supporting structure 2, is electrically connected by a plurality of electrical bridging links 4 to the conductor bar 3 assigned to the "+" pole and disposed, for example, on the conductor bar 3 assigned to the "−" pole and separated from this conductor bar 3 by a layer 32 of electrically isolating material, the other electrical terminal land 11 of one power semiconductor device 1 of the pair, said surface facing the surface 20 of the supporting structure 2, is electrically connected by a plurality of electrical bridging links 4 to the phase conductor bar 3 designated "N" and disposed, for example, on the conductor bar 3 assigned to the "+" pole and separated from this conductor bar 3 by a layer 32 of electrically isolating material, and the other electrical terminal land 11 of the other power semiconductor device 1 of the pair, said terminal land facing away from the surface 20 of the supporting structure 2, is electrically connected by a plurality of bridging links 4 to this phase conductor bar 3.

A free terminal land 30 of a conductor bar 3 of the stacked or vertically disposed conductor bars 3 is formed, for example, by a surface 300 of said conductor bar 3, said surface extending beyond another conductor bar 3 disposed on the first conductor bar 3, said surface 300 having a margin edge 31 over which is routed each individual bridging link 4 electrically connecting the free terminal land 30 of the first conductor bar 3 to an electrical terminal land 11 of a power semiconductor component 1.

Laterally adjacent to the conductor bars 3 disposed one above the other, electrical intermediate terminal lands 5 are disposed on the surface 20 of the supporting structure 2 in an electrically isolated manner and separately from each conductor bar 3, each of said intermediate terminal lands being electrically connected to a terminal land 11 of one or more power semiconductor components 1 and electrically connected in each case by a plurality of bridging links 4 to a conductor bar 3.

In the embodiment according to FIG. 2 and 3 there is provided, for example, for each power semiconductor component 1 an intermediate terminal land 5 which is in direct electrical contact with the terminal land 11 of this power semiconductor component 1 facing the surface 20 of the supporting structure 2 and which is fixed to said terminal land.

In the embodiment according to FIG. 2 and 3 there is also provided, for example, an intermediate terminal land 5 which is electrically isolated from the terminal lands 11 of the power semiconductor components 1 but which is electrically connected by a plurality of bridging links 40 to the terminal land 11 of a power semiconductor component 1 facing away from the surface 20 of the supporting structure 2.

Specifically the configuration for the embodiment according to FIGS. 2 and 3 is such that each of the two mutually assigned power semiconductor components 1 is disposed on an electrical intermediate terminal land 5 assigned to said power semiconductor component 1 so that the terminal land 11 of said power semiconductor component 1 facing the surface 20 of the supporting structure 2 and said assigned intermediate terminal land 5 are in direct electrical contact with one another, an intermediate terminal land 5 assigned to a power semiconductor component 1 is electrically connected by preferably a plurality of electrical bridging links 4 to a conductor bar 3 assigned to an electrical pole, e.g. to the "+" pole, the terminal land 11 of this power semiconductor component 1 facing away from the surface 20 of the supporting structure 2 is electrically connected by preferably a plurality of electrical intermediate bridging links 40 to the intermediate terminal land 5 assigned to the other power semiconductor component 1 and in turn electrically connected by preferably a plurality of electrical bridging links 4 to the phase conductor bar 3 designated "N", and the terminal land 11 of the other power semiconductor component 1 facing away from the surface 20 of the supporting structure 2 is electrically connected by preferably a plurality of electrical intermediate bridging links 40 to an intermediate terminal land 5 electrically isolated from the terminal lands 11 of the power semiconductor components 1 and electrically connected by preferably a plurality of electrical bridging links 4 to the conductor bar 3 assigned to the other electrical pole, e.g. to the "−" pole.

Each intermediate terminal land 5 preferably has a margin edge 51 over which each electrical bridging link 4 or 40 connected to said intermediate terminal land 5 is routed.

Such electrical intermediate terminal lands 5 can, although not shown, equally well be provided in the embodiment according to FIG. 1 where, for example, the power semiconductor components 1 of one or each row 10 can be disposed on a common intermediate terminal land 5 in such a way that a terminal land 11 of each power semiconductor component 1 facing the surface 20 of the supporting structure 2 is in direct electrical with said common intermediate terminal land 5, and the intermediate terminal land 5 can be connected by one or more electrical bridging links 4 to one of the two conductor bars 3 between which said row 10 is disposed.

An electrical intermediate terminal land 5 electrically isolated from the electrical terminal lands 11 of the power semiconductor components 1 and electrically connected on the one hand by one or more electrical bridging links 4 to said conductor bar 3 and on the other hand by one or more electrical intermediate bridging links to a terminal land 11 of a power semiconductor component 1 facing away from the surface 20 of the supporting structure 2 can also be disposed, for example, between a conductor bar 3 and an adjacent row 10 of power semiconductor components 1.

The surface 20 of the supporting structure 2 is preferably electrically conducting, and each power semiconductor component 1 and each electrical intermediate terminal land 5 is, as shown in FIG. 2, electrically isolated from said surface 20 by a layer 6 of electrically isolating material on the electrically conducting surface 20 of the supporting structure 2. The layer 6 can be, for example, a DCB ceramic substrate.

In the embodiment according to FIGS. 2 and 3, for example, all the power semiconductor components 1 and all the intermediate terminal lands 5 are mounted on a common layer 6 of electrically isolating material. Also in the embodiment according to FIG. 1, the power semiconductor components 1 of each row 10, even if not specifically shown, and in said row 10 any intermediate terminal lands 5 provided, are mounted on a common layer 6 of electrically isolating material.

The electrically conducting surface 20 of the supporting structure 2 is preferably assigned to an electrical pole, and a conductor bar 3 assigned to said electrical pole is preferably connected directly to said surface 20, the conductor bar 3 directly connected to the surface 20 being definable by said surface 20 itself.

In the embodiment according to FIGS. 2 and 3 the electrically conducting surface 20 of the supporting structure 2 is assigned, for example, to the "−" pole, and the lowest conductor bar 3 assigned to said "−" pole is directly mounted on the electrically conducting surface 20 of the supporting structure 2. It could also be formed by the electrically conducting surface 20 of the supporting structure 2 itself.

In the embodiment according to FIG. 1 it is likewise assumed, for example, that the electrically conducting surface 20 of the supporting structure 2 is assigned to the "−" pole, and that each conductor bar 3 assigned to said "−" pole is mounted directly on the electrically conducting surface 20 of the supporting structure 2 or is formed by said electrically conducting surface 20 of the supporting structure 2 itself. The other conductor bars 3 electrically isolated from the conductor bars 3 assigned to the "−" pole and from one another, i.e. the conductor bars 3 assigned to the "+" pole and the phase conductor bars 3 designated "N", must be electrically isolated from the electrically conducting surface 20 of the supporting structure 2, e.g. by a layer of electrically isolating material such as that provided by a layer 32 as shown in the embodiment according to FIGS. 2 and 3.

If cooling is provided, an individual conductor bar 3 can advantageously consist of a thin metal sheet even at high currents of hundreds of amperes in a hot, high vibration environment up to 165° C.

On the surface 20 of the supporting structure 2 there is mounted a circuit board 7 of electrically isolating material on which at least one driver circuit 8 and one or more electrical terminal lands 71 are mounted, each terminal land 71 of the circuit boards 7 being connected by a least one electrical bridging link 41 to a terminal land 12 of a power semiconductor component 1, said terminal land preferably being a control terminal land of said component 1.

In FIG. 1, three circuit boards 7 are adjacently disposed, for example, on a common conductor bar 33 and each board is assigned to a phase conductor bar 3 designated "N". The driver circuit 8 of the circuit board 7 is shown only on the middle circuit board 7 by way of indication. Even though not shown, in reality one such driver circuit is present on each of the other two circuit boards 7. Also not shown in FIG. 1 for simplicity's sake are the terminal lands present on each circuit board 7 and corresponding to the terminal lands 71 of the circuit board 7 in FIG. 2, and the terminal lands present on each power semiconductor component 1 and corresponding to the terminal lands 12 in FIG. 2.

One of these terminal lands of each circuit board 7 in FIG. 1 is electrically connected by an electrical bridging link 41 to its corresponding terminal land on the first power semiconductor component 1 of the row 10 on one side of the phase conductor bar 3 to which this circuit board 7 belongs, and the other terminal land of this circuit board 7 is connected by an electrical bridging link 41 to its corresponding terminal land on the first power semiconductor component 1 of the row 10 on the other side of said phase conductor bar 3. In each pair of such rows 10, the mutually corresponding terminal lands of adjacent power semiconductor components 1 are in each case electrically connected by a bridging link 41 of which only is shown in FIG. 1. In each pair of such rows 10, for example, all the power semiconductor components 1 of a row 10 are switched or controlled in push-pull with all the power semiconductor components 1 of the other row 10 and vice versa.

An electrical bridging link 4, 40 and/or 41 can consist of a bond wire consisting in particular of a welded fillet or a soldered link. When using bond wires or fillets for the bridging links 4, 40, it is advisable, because of the small cross section, to use two or more such wires or fillets, as shown in FIG. 2, for the electrical power connection of an individual terminal land 11 of a power semiconductor component 1 to an intermediate terminal land 5 or a conductor bar 3 and likewise for the electrical power connection of an individual intermediate terminal land 5 to a conductor bar 3. A soldered link, on the other hand, can be implemented with a very large cross section, so that an electrical power connection can be established using an individual soldered link of this kind.

To cool the arrangement, the supporting structure 2 is linked to a heat sink 9 preferably having a cooler 90 which is thermally connected to the supporting structure 2 under the surface 20 of said supporting structure 2. The cooler 90 is preferably incorporated in the supporting structure 2.

In an exemplary arrangement according to the invention disposed in close proximity to a hot, strongly vibrating internal combustion, a conductor bar 3 and a surface 20' of the supporting structure 2 facing away from the surface 20 of the supporting structure 2 are clamped together by a clamping device 100 gripping around the supporting structure 2 and made of electrically conducting material through which current can be conducted to or from the conductor bar 3.

There is additionally disposed, e.g. on the surface 20' of the supporting structure 2 facing away from the surface 20 of the supporting structure 2, a capacitor 110 having two electrodes 111 and 112 isolated from one another by a dielectric 113, of which one electrode 111 is assigned to one of the opposite electrical poles, e.g. the "−" pole in the embodiments shown in the Figures, and is in surface contact with the surface 20' of the supporting structure 2 facing away from the surface 20, and the other electrode 112 is assigned to the other electrical "+" pole.

The electrode 111 of the capacitor 110 which is in surface contact with the surface 20' of the supporting structure 2 facing away from the surface 20 and which is assigned e.g. to an electrical "−" pole is electrically connected to a conductor bar 3 which is assigned to this electrical "−" pole, the other electrode 112 of the capacitor 110 being electrically connected to a conductor bar 3 which is assigned to the electrical "+" pole.

A preferred and advantageous use of the arrangement according to the invention is in an engine compartment of a motor vehicle and in particular its use in that location for supplying an electrical load of a motor vehicle, the term "load" being taken to mean the motor vehicle equipment already mentioned above.

In a preferred embodiment of the arrangement according to the invention for such an application, the one or more electrically isolating layers 6 with the power semiconductor components 1 mounted thereon are built up on the surface 20 of the supporting structure 2 implemented in the form of a base plate. For example, a layer 6 of electrically isolating material is used whose flat sides facing away from one another are coated with metal, said layer 6 lying flat on the electrically conducting surface 20 of the supporting structure 2 with one of the metal-coated flat sides and being soldered to said surface 20, whereas, on the other metal-coated flat side of said layer 6 facing away from the surface 20, one or more of the power semiconductor components 1 are soldered to a terminal land 11 lying flat thereon and separation channels are patterned in the metal coating of said other flat side for forming intermediate terminal lands 5.

The supporting structure 2 can also already contain the integrated cooler 90 which incorporates channels 91 for circulating a coolant. The supporting structure consists of metal, for example, and is electrically conducting. It can additionally be used as the "−" pole. The conductor bars 3 in the form of thin metal sheets are adhesively attached directly adjacent to the substrate or substrates 6 in an isolating manner to the surface 20 of the supporting structure 2 or soldered to the conductor bar 3 right at the bottom for the "−" pole. The contacting to the substrate or substrates in the form of electrically isolating layers 6 is accomplished by a plurality of short bridging links 4 in the form of bond wires, welded fillets or soldered links. The driver circuits 8 for the power semiconductors, preferably MOSFETs, can likewise be integrated adjacent to the electrically isolating layers 6 on the supporting structure 2.

Because of the high ripple current, the capacitor 110 constituting a reservoir capacitor develops non-negligible losses in the form of heat which must be dissipated because of the already very high ambient temperature. For this purpose the capacitor 110 is brought into thermal contact with the back of the cooler 90, e.g. by adhesively attaching or press-fitting to an electrode 112 to be used as + pole and in contact over its entire surface, in the embodiment according to FIGS. 2 and 3, with a cover 60 of electrically conducting material which lies with one edge 61 resting against a layer 34 of electrically isolating material which is mounted adjacent to the electrode 111 of the capacitor 110 assigned to the "−" pole on the surface 20' of the supporting structure 2 facing away from the surface 20 and facing towards the capacitor 110.

The electrode 111 for the "−" pole of the capacitor 110 is in direct planar contact with the surface 20' of the supporting structure 2 facing the capacitor 110. An electrically conducting connection with a conductor bar 3 assigned to the "+" pole and to a cable lug 103 of a connecting cable is established by a clamping device 100 which can have, for example, for connection to the "+" pole, an electrically conducting screw clamp 101 isolated from the supporting structure 2 and the electrode 111 of the capacitor 110 assigned to the "−" pole and having a handle 102 of electrically isolating material for manual access, said clamp gripping around the supporting structure 2 with the cooler 90 and pressing the capacitor 110 by the cover 60 against the supporting structure 2.

In the embodiment according to FIGS. 2 and 3, a clamping device 100 can also be implemented as in the embodiment according to FIG. 1. In this embodiment the clamping device 100 has a plurality of clamps 101 each of which grips around the supporting structure 2 and the capacitor 110 of one surface 20 of the supporting structure 2 up to the electrode 112 of the capacitor 110 assigned to the "+" pole. A clamp 101 assigned to the "+" pole is electrically conducting, contacts the electrode 112 of the capacitor 110 assigned to said "+" pole and a conductor bar 3 assigned to said "+" pole or the common conductor bar 33 and is electrically isolated from the supporting structure 2 and the electrode 111 of the capacitor 110 assigned to the "−" pole. For example, two such electrically conducting clamps 101 are provided.

All the other clamps 101 are essentially used to fix the supporting structure 2 and capacitor 110 mechanically to one another and each clamp grips around the supporting structure 2 and the capacitor 110 of one surface 20 of the supporting structure 2 up to the electrode 112 of the capacitor 110 assigned to the "+" pole. If any such mechanical clamp 101 is electrically conducting, it must be electrically isolated from the capacitor electrode 112 assigned to the "+" pole.

In FIG. 1 additional conductor bars 330 in the form of metal strips are present, each of which additionally electrically interconnects the electrode 112 of the capacitor 110 assigned to the "+" pole and the conductor bars 3 assigned to said "+" pole, in particular via the common conductor bar 33, and helps to further improve the electrical conductivity between the electrode 112 of the capacitor 110 and a conductor bar 3 assigned to the "+" pole.

The capacitor 110 is, for example, preferably implemented in such a way that each electrode 111 and 112 consists of a metal plate or foil 111' or 112' from which thin planar-shaped parallel metal laminations 114 project vertically in a comb-tooth-like manner, some of which can be seen in section in FIG. 3 in an opening 116 (not present in reality) in an outer wall 115 of the capacitor 110 and are perpendicular to the drawing plane of FIG. 3. The two plates 111', 112' are brought together in such a way that, apart from one lamination, at one end of each plate each lamination of a plate is disposed between two laminations of another plate and separated from these two laminations by the dielectric 113.

In the embodiments shown, current is collected by the phase conductor bars 3 designated "N". The "−" pole is preferably at ground potential, the "+" pole e.g. at 6 V, 12 V or 42 V.

It must be borne in mind that all the water-rich parts leading away from the supporting structure 2 tend to oscillate during vibrations, resulting in rapid fatigue of the joints particularly at the anticipated high temperatures. Because of the required currents of several hundred amperes, the supply leads would have to be implemented with a very large cross-section in order to prevent them from overheating in the very hot environment. By means of adhesive attachment to the supporting structure 2, the losses in the form of heat can be dissipated so that even thin metal sheets are adequate as conductor bars 3. As the bars 3 as well as the layers 6 of isolating material are disposed directly on the supporting structure 2 and closely adjacent to one another, the oscillations against one another remain negligibly small. Short bridging links 4, 40, 41 have natural frequencies such that they are unlikely to be excited to resonance. A clamping device 100 with connections in the form of electrically conducting clamps 101 on the supporting structure with the cooler 90 additionally ensures that the thick connection cables cannot pull off the adhesively attached conductor bars 3.

The invention claimed is:

1. Arrangement, comprising:
a common support structure with an electrically conducting surface;
at least one power semiconductor component with at least two electrical terminal lands disposed separately from one another,
each power semiconductor component mounted, in an electrically isolated manner, on the electrically conducting surface of the common supporting structure;
at least two conductor bars, disposed separately from one another and electrically isolated from one another, mounted on the electrically conducting surface adjacently to and electrically isolated from each power semiconductor component;
electrical bridging links electrically connecting one of the electrical terminal lands of each power semiconductor component to one of the conductor bars and electrically connecting another of the electrical terminal lands of each power semiconductor component to another of the conductor bars; and
a clamping device clamping together the one conductor bar and the opposite surface of the supporting structure facing away from the conducting surface of the supporting structure, the clamping device being of electrically conducting material gripping around the supporting structure and providing a path for current routing to and from the one conductor bar.

2. Arrangement according to claim 1, wherein,
there are at least two power semiconductor components,
a first electrical terminal land of a first power semiconductor component is electrically connected by at least one of the electrical bridging links to a first conductor bar of a first electrical pole,
a first electrical terminal land of a second power semiconductor component is electrically connected by at least one of the electrical bridging links to a second conductor bar of a second electrical pole, the first pole being opposite in polarity to the second pole, and
a second electrical terminal of the first and second power semiconductor components are electrically connected by at least one of the electrical bridging links to a third conductor bar.

3. Arrangement according to claim 26, wherein the at least two conductor bars are disposed adjacently on the conducting surface of the supporting structure.

4. Arrangement according to claim 2, wherein the first, second and third conductor bars are disposed adjacently on the conducting surface of the supporting structure.

5. Arrangement according to claim 4, wherein,
at least two of the conductor bars are disposed vertically one above another,
the vertically disposed conductor bars are electrically isolated from one another on the conducting surface,
each of the vertically disposed conductor bars comprises a free terminal land connected, via at least one of the electrical bridging links, to a corresponding electrical terminal land of at least one power semiconductor component.

6. Arrangement of claim 5, wherein,
the free terminal land of one of the vertically disposed conductor bars is formed by a surface projecting out beyond another of the vertically disposed conductor bars,
said projecting surface having a margin edge routing the at least one electrical bridging link connecting the free terminal land to the corresponding electrical terminal land of the power semiconductor component.

7. Arrangement according to claim 1, further comprising:
at least one electrical intermediate terminal land located laterally adjacent to and separate from one conductor bar, electrically isolated from the conducting surface,
the one electrical intermediate terminal land electrically connected to one terminal land of at least one power semiconductor component, and
the one electrical intermediate terminal land is electrically connected by at least one of the electrical bridging links to the one conductor bar.

8. Arrangement of claim 7, wherein the one electrical intermediate terminal land and the terminal land of the one power semiconductor component are in direct electrical contact and are fixed to one another.

9. Arrangement of claim 7, wherein the one intermediate terminal land and the terminal land of the one power semiconductor component are electrically isolated from one another but for electrical connection by electrical bridging links.

10. Arrangement of claim 8, wherein the a another intermediate terminal land and the terminal land of another power semiconductor component are electrically isolated from one another but for electrical connection by electrical bridging links.

11. Arrangement of claim 7, wherein the one intermediate terminal land has a margin edge connecting to the at least one electrical bridging link.

12. Arrangement of claim 7, wherein,
there are plural intermediate terminal lands,
each power semiconductor component and each electrical intermediate terminal land are electrically isolated, from the conducting surface of the supporting structure, by a layer of electrically isolating material located on the conducting surface of the supporting structure.

13. Arrangement of claim 12, wherein two or more power semiconductor components and at least one of the intermediate terminal lands are mounted on a common layer of the electrically isolating material.

14. Arrangement according to claim 12, wherein,
the conducting surface of the supporting structure is assigned to a first electrical pole,
the one conductor bar is also assigned to the first electrical pole, and
the one conductor bar is directly connected to conducting surface of the supporting surface.

15. Arrangement according to claim 14, wherein the one conductor bar, directly connected to the conducting surface of the supporting surface, is defined by the conducting surface itself.

16. Arrangement according to claim 1, further comprising:
a circuit board made of electrically isolating material and mounted on the conducting surface of the supporting structure,
the circuit board comprising at least one driver circuit and at least one electrical terminal land,
each terminal land of the circuit board being connected by at least one electrical bridging link to the one of the terminal lands of the power semiconductor components.

17. Arrangement according to claim 1, wherein the electrical bridging link consists of a bond wire.

18. Arrangement according to claim 1, wherein the electrical bridging link consists of a fillet.

19. Arrangement according to claim 1, wherein the electrical bridging link consists of a soldered link.

20. Arrangement comprising:
a common support structure with an electrically conducting surface;
at least one power semiconductor component with at least two electrical terminal lands disposed separately from one another,
each power semiconductor component mounted, in an electrically isolated manner, on the electrically conducting surface of the common supporting structure;
at least two conductor bars, disposed separately from one another and electrically isolated from one another, mounted on the electrically conducting surface adjacently to and electrically isolated from each power semiconductor component;
electrical bridging links electrically connecting one of the electrical terminal lands of each power semiconductor component to one of the conductor bars and electrically connecting another of the electrical terminal lands of each power semiconductor component to another of the conductor bars; and
a heat sink coupled to the supporting structure.

21. Arrangement according to claim 20, wherein the heat sink comprises a cooler thermally connected to the supporting structure under the conducting surface of the supporting structure.

22. Arrangement according to claim 21, wherein the cooler is integrated in the supporting structure.

23. Arrangement according to claim 1, further comprising:
a capacitor disposed on an opposite surface of the supporting structure facing away from the conducting surface of the supporting structure,
the capacitor with two capacitor electrodes isolate by a dielectric,
one capacitor electrode assigned to one of two opposite electrical poles and in planar contact with the opposite surface of the supporting structure,
another capacitor electrode assigned to a second of the two opposite electrical poles.

24. Arrangement according to claim 23, wherein,
the one capacitor electrode is electrically connected to a corresponding conductor bar also assigned to be one electrical pole, and
the another capacitor electrode is electrically connected to another corresponding conductor bar also assigned to the second electrical pole.

25. Arrangement according to claim 1, wherein the supporting structure is configured for installation in a motor vehicle engine compartment.

26. Arrangement according to claim 25, further comprising:
connections for supplying an electrical load of the motor vehicle.

27. Arrangement, comprising:
a common support structure with an electrically conducting surface;
at least one power semiconductor component with at least two electrical terminal lands disposed separately from one another,
each power semiconductor component mounted, in an electrically isolated manner, on the electrically conducting surface of the common supporting structure;
at least two conductor bars, disposed separately from one another and electrically isolated from one another, mounted on the electrically conducting surface adjacently to and electrically isolated from each power semiconductor component;
electrical bridging links electrically connecting one of the electrical terminal lands of each power semiconductor component to one of the conductor bars and electrically connecting another of the electrical terminal lands of each power semiconductor component to another of the conductor bars; and
a vibration-suppressing clamping device clamping together the one conductor bar and the opposite surface of the supporting structure facing away from the conducting surface of the supporting structure,
the clamping device being of electrically conducting material gripping around the supporting structure and providing a path for current routing to and from the one conductor bar,
the clamping device comprising a connection to the "+" pole in the form of plural, spaced apart conducting screw clamps isolated from the supporting structure and each having a handle of electrically isolating material, the screw clamps gripping around the supporting structure.

* * * * *